United States Patent
Chuang et al.

(10) Patent No.: US 7,417,329 B2
(45) Date of Patent: Aug. 26, 2008

(54) SYSTEM-IN-PACKAGE STRUCTURE

(75) Inventors: Meng-Jung Chuang, Kao-Hsiung (TW); Cheng-Yin Lee, Tai-Nan (TW); Wei-Chang Tai, Kao-Hsiung (TW); Chi-Chih Chu, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 139 days.

(21) Appl. No.: 11/420,230

(22) Filed: May 25, 2006

(65) Prior Publication Data
US 2007/0132093 A1 Jun. 14, 2007

(30) Foreign Application Priority Data
Dec. 14, 2005 (TW) .............. 94144310 A

(51) Int. Cl.
  *H01L 23/48* (2006.01)
  *H01L 23/52* (2006.01)
  *H01L 29/40* (2006.01)
(52) U.S. Cl. .................. 257/786; 257/787

(58) Field of Classification Search .......... 257/786, 257/784, 778, 780, 781, 787, 698, 700
See application file for complete search history.

(56) References Cited

U.S. PATENT DOCUMENTS

| 5,744,084 A | 4/1998 | Chia |
| 6,617,680 B2 | 9/2003 | Chien-Chih |
| 6,635,209 B2 | 10/2003 | Huang |
| 6,692,988 B2 | 2/2004 | Fang |
| 6,838,761 B2 | 1/2005 | Karnezos |
| 7,208,844 B2 * | 4/2007 | Andoh ............ 257/787 |
| 2007/0228542 A1 * | 10/2007 | Hussa ............ 257/686 |

* cited by examiner

*Primary Examiner*—S. V Clark
(74) *Attorney, Agent, or Firm*—Winston Hsu

(57) ABSTRACT

A system-in-package structure includes a carrier substrate having a molding area and a periphery area, at least a chip disposed in the molding area, an encapsulation covering the chip and the molding area, a plurality of solder pads disposed in the periphery area, and a solder mask disposed in the periphery area and partially exposing the surface of the solder pads. The solder mask includes at least a void therein.

17 Claims, 5 Drawing Sheets

SYSTEM-IN-PACKAGE STRUCTURE

BACKGROUND OF THE INVENTION

1. Field of the Invention

The invention relates to a system-in-package, and more particularly, to a system-in-package having a void in the periphery area of a carrier substrate.

2. Description of the Prior Art

The functionality of electronic products continues to increase, and mirror that is the development of packaging processes. Packaging processes continue a trend toward the high density, miniature size, multi-chip, and three dimensional design. In general, various high density package structures commonly utilized today include wafer level packages, three dimensional packages, multi-chip packages, and system-in-package structures. Preferably, an ideal package structure involves the incorporation of virtually all of the integrated circuits into a silicon chip, such as a system on chip (SoC) design. However, how to successfully incorporate the complex circuit functions into a single chip has not only increased the fabrication difficulty, but has also increased the size of the chip and the overall cost and yield of the fabrication process. Hence, a system-in-package structure that emphasizes the traits of small volume, high frequency, high speed, short production cycle, low cost, and the ability to integrate chips with different circuit functions has become a popular packaging technique.

Please refer to FIG. 1. FIG. 1 is a perspective diagram illustrating a system-in-package structure 10 according to the prior art. As shown in FIG. 1, the system-in-package structure 10 includes a carrier substrate 16, in which the surface of the carrier substrate 16 defines a molding area 30 and a periphery area 32. The molding area 30 includes a chip 12 disposed on the carrier substrate 16, an adhesive layer 14 disposed between the carrier substrate 16 and the chip 12, and a molding compound 24 covering the chip 12 and part of the carrier substrate 16. Additionally, the system-in-package structure 10 includes a plurality of wires 18 electrically connected to the chip 12 and the carrier substrate 16 and a plurality of solder balls 22 disposed on the bottom surface of the carrier substrate 16, in which the solder balls 22 are connected to the chip 12 through the circuits (not shown) within the carrier substrate 16. The periphery area 32 includes a solder mask 32 and a plurality of solder pads 36 disposed on the surface of the carrier substrate 16, in which the height of the surface of the solder pads 36 is equivalent to the height of the solder mask 34 surface.

However, the molding compound 24 covering the chip 12 and the carrier substrate 16 often flush out of the molding area 30 and flood the surface of the periphery area 32 during a molding process. Since the height of the solder mask 36 surface is equal to the height of the solder pads 36 surface, excessive molding compound 24 utilized during the molding process will flood. The flood covers the solder pads 36 and the solder mask 34 in the periphery area 32 thereby influencing the ball mounting process thereafter. Consequently, the stability of the passive devices (not shown), active devices (not shown), and solder balls (not shown) disposed on the solder pads 36 is not ideal.

SUMMARY OF THE INVENTION

It is therefore an objective of the present invention to provide a package structure having a void in the periphery of a carrier substrate to improve the problem of contamination of solder pads by the flooding of molding compound.

According to the present invention, a system-in-package structure includes a carrier substrate, in which the surface of the carrier substrate defines a molding area and a periphery area; a chip disposed in the molding area; a molding compound disposed in the molding area and covering the chip; a plurality of solder pads disposed on the surface of the carrier substrate and in the periphery area; and a solder mask disposed on the periphery area and partially covering the surface of the solder pads, in which the solder mask includes at least a void.

Preferably, the present invention provides a solder mask having a void therein in the periphery area of a carrier substrate. During the molding process the excess molding compound flushed out from the molding area is able to flow into the void and avoid contaminating the solder pads, thereby improving the yield and stability of the ball mounting process performed on the solder pads thereafter.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
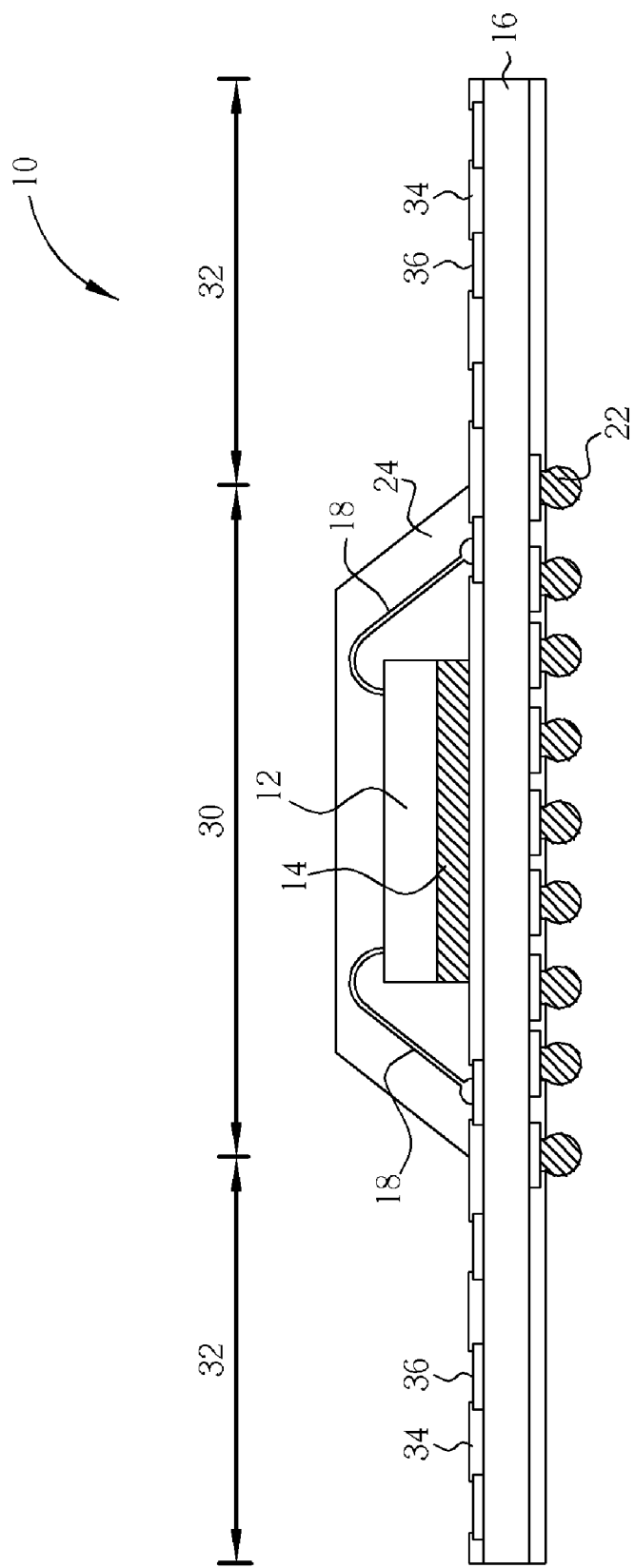
FIG. 1 is a perspective diagram illustrating a system-in-package structure according to the prior art.
Figure 2:
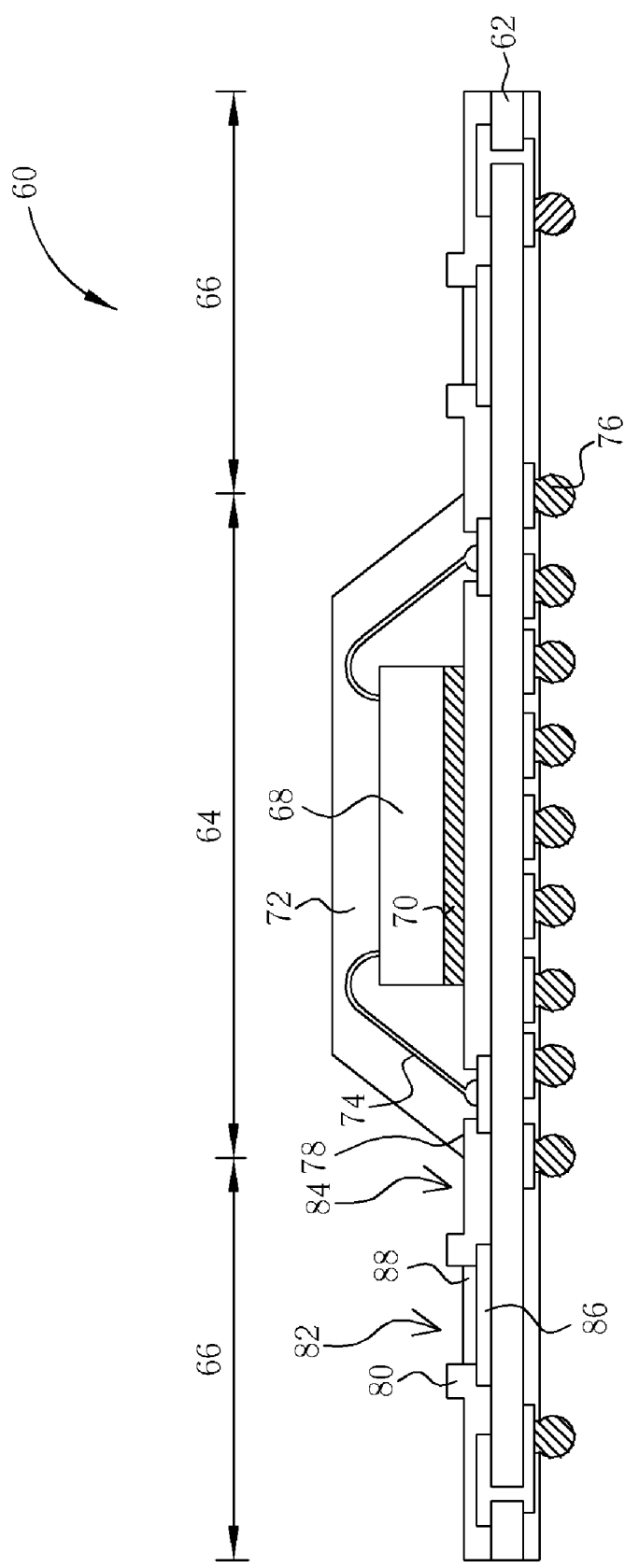
FIG. 2 and FIG. 3 are perspective diagrams illustrating a bottom package structure according to the preferred embodiment of the present invention.
Figure 3:
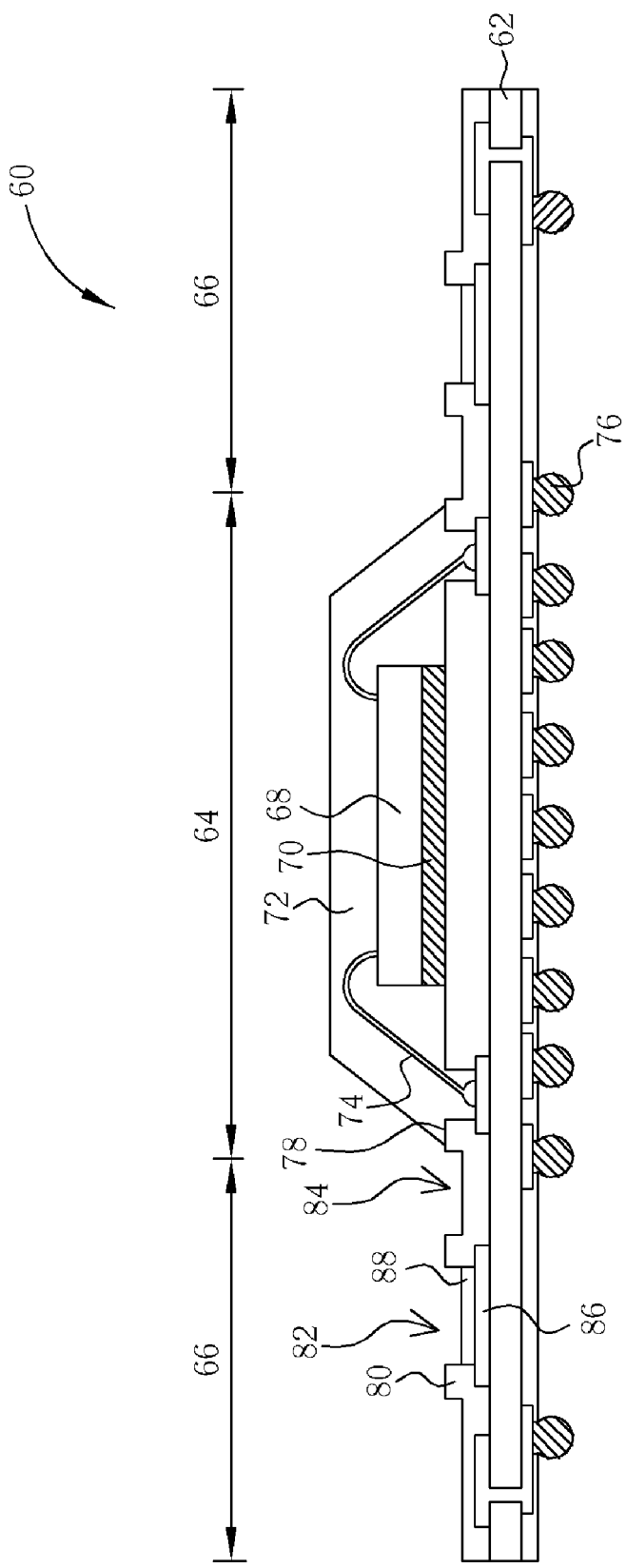

Please refer to FIG. 2 and FIG. 3. FIG. 2 and FIG. 3 are perspective diagrams illustrating a bottom package structure 60 according to the preferred embodiment of the present invention. As shown in FIG. 2 and FIG. 3, the bottom package structure 60 includes a carrier substrate 62. The surface of the carrier substrate 62 defines a molding area 64 and a periphery area 66, in which the depth of the molding area 64 is greater than the depth of the periphery area 66. The bottom package structure 60 also includes at least a chip 68, positioned on the surface of the carrier substrate 62 and within the molding area 64, an adhesive layer 70 disposed between the carrier substrate 62 and the chip 68, and a molding compound 72 covering the chip 68 and part of the carrier substrate 62. Please note that the chip 68 can be, for example, a flip chip. Additionally, the bottom package structure 60 includes a plurality of wires 74 formed by wire bonding for electrically connecting the chip 68 and the carrier substrate 62, and a plurality of solder balls 76 disposed on the bottom surface of the carrier substrate 62, in which the solder balls 76 are electrically connected to the chip 68 via the circuits (not shown) inside the carrier substrate 62.

Preferably, the periphery area 66 of the bottom package structure 60 includes a solder mask 80 and a plurality of solder pads 82 disposed on the carrier substrate 62. The solder pads 82 are utilized to electrically connect other passive devices, active devices, chips, or packages in a ball mounting process. Preferably, the height of the solder pads 82 is not only greater than or equal to the height of the molding area surface, but also greater than the height of the solder mask 80 surface. The molding compound 72 and the carrier substrate 62 includes a contact surface 78 therein between, in which the contact surface 78 is lower than the solder mask 80 surface and the tip of the opening above the solder pads 82, as shown in FIG. 2, are equivalent to the tip of the opening above the solder pads 82, as shown in FIG. 3.

According to the preferred embodiment of the present invention, the solder mask 80 not only surrounds a plurality of solder pads 82 on the carrier substrate 62, but also includes a void 84, in which the void 84 is formed between the solder pads 82. Hence, if the molding compound 72 covering the chip 68 and a portion of the carrier substrate 62 flushes out of the molding area 64 during a molding process, the flooded molding compound 72 can be contained within the void 84, thereby preventing the solder pads 82 situated in the periphery area 66 from suffering from any contamination by the molding compound 72. The formation of the solder pads 82 is achieved by stacking metal layers one over another, such as first forming a first metal layer 86 on the surface of the carrier substrate 62, and then forming a second metal layer 88 on top of the first metal layer 86. The solder mask 80 can be a multi-layer solder mask, in which the solder mask 80 can be etched to form the void 84.

Figure 4:
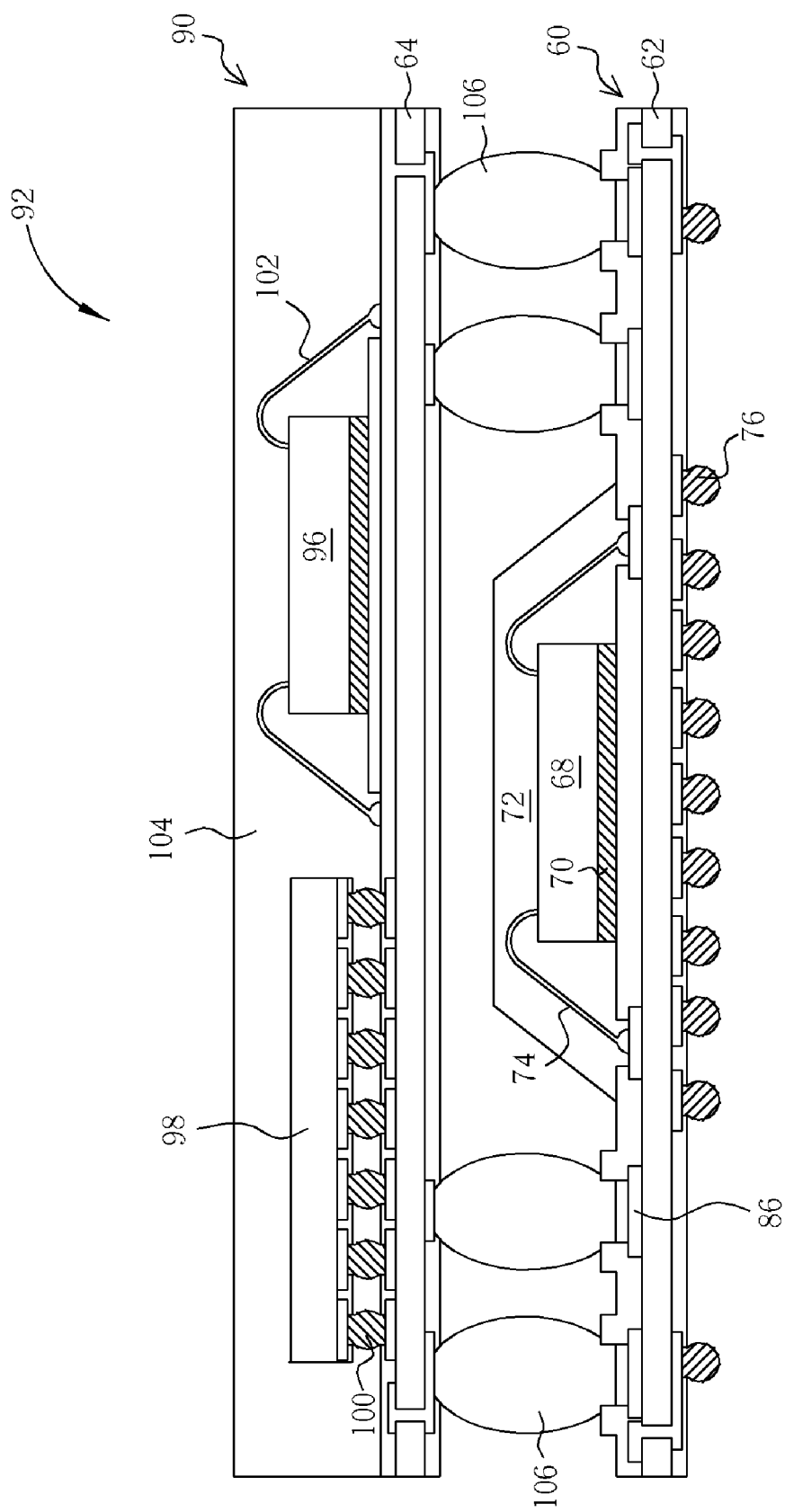
FIG. 4 and FIG. 5 are perspective diagrams illustrating a system-in-package structure according to another embodiment of the present invention.
Figure 5:
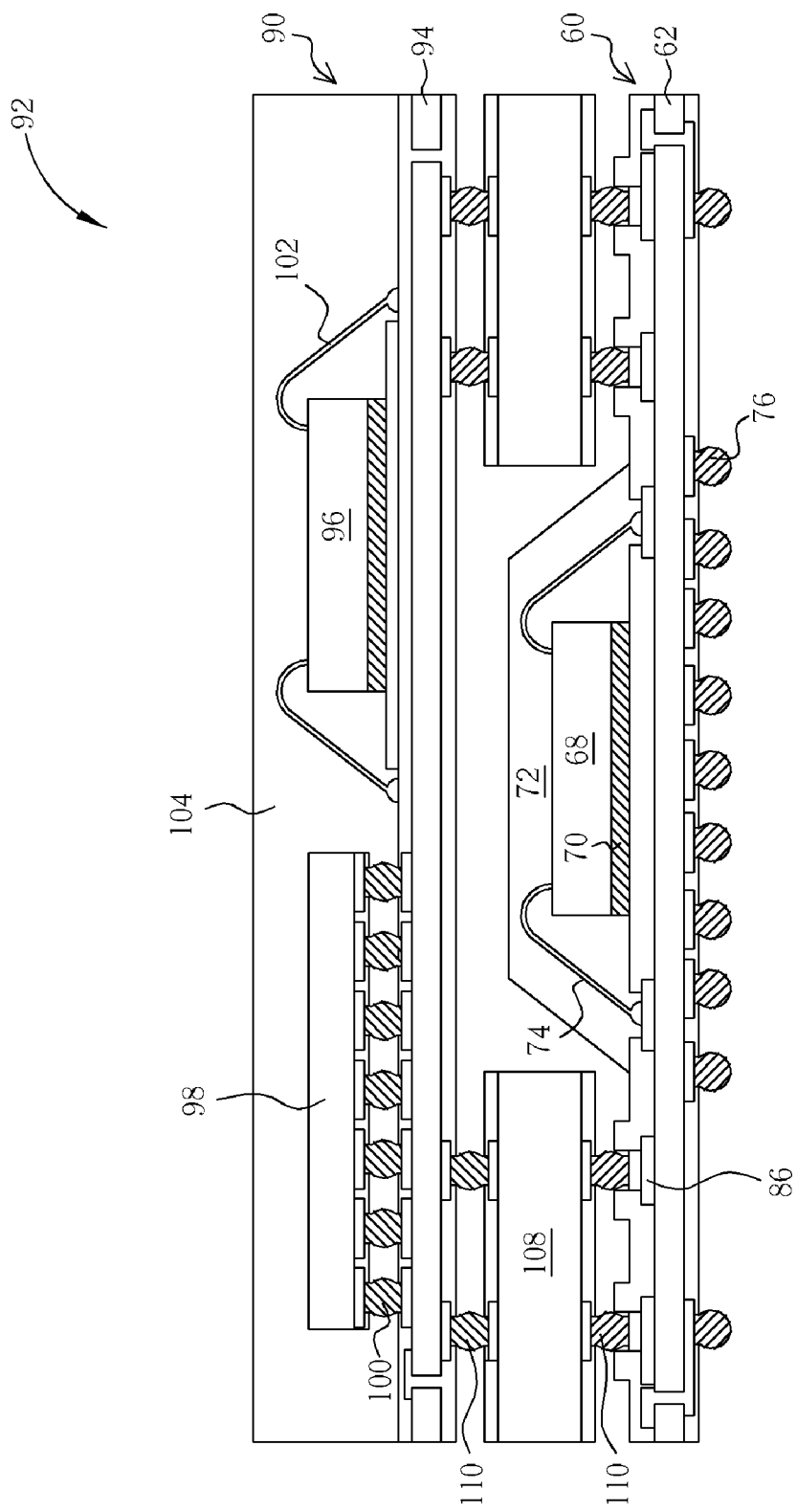

Please refer to FIG. 4 and FIG. 5. FIG. 4 and FIG. 5 are perspective diagrams illustrating a system-in-package structure 92 according to another embodiment of the present invention. As shown in FIG. 4 and FIG. 5, the present invention is able to combine the bottom package structure 60 and a top package structure 90 to form a system-in-package structure 92. As described above, the bottom package structure 60 includes a carrier substrate 62, in which the surface of the carrier substrate 62 defines a molding area 64 and a periphery area 66. The bottom package structure 60 also includes at least a chip 68, such as a flip chip positioned on the surface of the carrier substrate 62, an adhesive layer 70 disposed between the carrier substrate 62 and the chip 68, and a molding compound 72 covering the chip 68 and a portion of the carrier substrate 62. Additionally, the bottom package structure 60 includes a plurality of wires 74 formed by wire bonding for electrically connecting the chip 68 and the carrier substrate 62, and a plurality of solder balls 76 disposed on the bottom surface of the carrier substrate 62, in which the solder balls 76 are electrically connected to the chip 68 via the circuits (not shown) inside the carrier substrate 62.

The top package structure 90 includes a carrier substrate 94 and at least a chip 96 and 98 disposed on the surface of the carrier substrate 94. The chip 96 is connected to the carrier substrate 94 via a plurality of wires 102 through wire bonding, whereas the chip 98 is connected to the surface of the substrate 94 via a plurality of solder balls 100 through a flip chip packaging process. The top package structure 90 also includes a molding compound 104 covering the chip 96 and 98, the wires 102, and the carrier substrate 94. As shown in FIG. 4, the bottom package structure 60 is connected to the top package structure 90 via a plurality of solder balls 106. Additionally, as shown in FIG. 5, the present invention is able to dispose a substrate 108 between the top package structure 90 and the bottom package structure 60, and utilize a plurality of solder balls 110 and the carrier substrate 108 to connect the bottom package structure 60 and the top package structure 90 and form the system-in-packages structure 92.

In contrast to the conventional system-in-package structure, the present invention provides a solder mask having a void therein in the periphery area of a carrier substrate, such that the excess molding compound flushed out from the molding area during the molding process is able to flow into the void and avoid contaminating the solder pads, thereby improving the yield and stability of the ball mounting process performed on the solder pads thereafter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system-in-package structure, comprising:
   a carrier substrate, wherein the surface of the carrier substrate defines a molding area having a contact surface and a periphery area;
   a chip disposed in the molding area;
   a molding compound disposed in the molding area and covering the chip;
   a plurality of solder pads disposed on the surface of the carrier substrate and in the periphery area; and
   a solder mask disposed on the periphery area and partially exposing the surface of the solder pads, wherein the solder mask comprises at least one void, wherein the height of the solder pads is higher than the contact surface of the molding area and thereby preventing the molding compound from flooding out of the molding area.

2. The system-in-package structure of claim 1, wherein the chip is a flip chip.

3. The system-in-package structure of claim 1 further comprising a plurality of wires connecting the chip and the carrier substrate, wherein the wires are covered by the molding compound.

4. The system-in-package structure of claim 1 further comprising a plurality of solder balls disposed on the bottom surface of the carrier substrate.

5. The system-in-package structure of claim 1, wherein the depth of the molding area is greater than the depth of the periphery area.

6. The system-in-package structure of claim 1, wherein the molding compound and the carrier substrate comprise a contacting surface, the contacting surface is lower than the solder mask, and the tip of an opening above the solder pads.

7. A system-in-package structure, comprising:
   a bottom package structure, comprising:
      a first carrier substrate, wherein the surface of the first carrier substrate defines a molding area and a periphery area;
      a first chip disposed in the molding area;
      a first molding compound disposed in the molding area and covering the first chip;
      a plurality of solder pads disposed on the surface of the first carrier substrate and in the periphery area; and
      a solder mask disposed on the periphery area and partially exposing the surface of the solder pads, wherein the solder mask comprises at least one void providing a containment area for mold overflow;
   a top package structure, comprising:
      a second carrier substrate;
      a second chip disposed on the surface of the second carrier substrate;
      a second molding compound covering the second chip; and
      a plurality of solder balls bonding to the upper surface of the first carrier substrate and the bottom surface of the second carrier substrate.

8. The system-in-package structure of claim 7, wherein the first chip and the second chip are flip chips.

9. The system-in-package structure of claim 7, wherein the bottom package structure further comprises a plurality of wires connecting the first chip and the first carrier substrate, wherein the wires are covered by the first molding compound.

10. The system-in-package structure of claim 7, wherein the top package structure further comprises a plurality of wires connecting the second chip and the second carrier substrate, wherein the wires are covered by the second molding compound.

11. The system-in-package structure of claim 7, wherein the bottom package structure comprises a plurality of solder balls disposed on the bottom surface of the first carrier substrate.

12. The system-in-package structure of claim 7, wherein the depth of the molding area is greater than the depth of the periphery area.

13. The system-in-package structure of claim 7, wherein the surface of the solder pads is higher than or equal to the surface of the molding area.

14. The system-in-package structure of claim 7, wherein the surface of the solder pads is higher than or equal to the surface of the solder mask.

15. The system-in-package structure of claim 7 further comprising a third carrier substrate, wherein the third carrier substrate connects the bottom packages structure and the top package structure through the solder balls.

16. The system-in-package structure of claim 7, wherein the first molding compound and the first carrier substrate comprise a contacting surface, the contacting surface is lower than the solder mask, and the tip of an opening above the solder pads.

17. A system-in-package structure, comprising:
   a carrier substrate, wherein the surface of the carrier substrate defines a molding area having a contact surface and a periphery area;
   a chip disposed in the molding area;
   a molding compound disposed in the molding area and covering the chip;
   a plurality of solder pads disposed on the surface of the carrier substrate and in the periphery area; and
   a solder mask disposed on the periphery area and partially exposing the surface of the solder pads, wherein the solder mask comprises at least one void and the height of the solder pads is greater than the height of the solder mask and thereby preventing the molding compound from flooding out of the molding area.

* * * * *